United States Patent
Stevens et al.

(10) Patent No.: US 11,353,510 B1
(45) Date of Patent: Jun. 7, 2022

(54) METHOD FOR TESTING A DEVICE UNDER TEST

(71) Applicant: Endress+Hauser Flowtec AG, Reinach (CH)

(72) Inventors: Jerry E. Stevens, Greenwood, IN (US); Hao Zhu, Freising (DE); Marcel Braun, Inzlingen (DE)

(73) Assignee: ENDRESS+HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 17/134,806

(22) Filed: Dec. 28, 2020

(51) Int. Cl.
  *G01R 31/28* (2006.01)
  *G01R 31/319* (2006.01)

(52) U.S. Cl.
  CPC ..... *G01R 31/3191* (2013.01); *G01R 31/2879* (2013.01)

(58) Field of Classification Search
  CPC ............ G01R 1/06783; G01R 31/1281; G01R 31/3191; G01R 33/0023; G01R 35/00; G01R 35/005
  See application file for complete search history.

(56) References Cited

U.S. PATENT DOCUMENTS

| | | | | |
|---|---|---|---|---|
| 11,009,525 | B1* | 5/2021 | Mody | G01R 31/2831 |
| 2004/0032274 | A1* | 2/2004 | Cader | G01R 31/2891 |
| | | | | 324/750.08 |
| 2020/0271494 | A1 | 8/2020 | Zhu et al. | |

* cited by examiner

*Primary Examiner* — Tung X Nguyen
(74) *Attorney, Agent, or Firm* — Christopher R. Powers; Endress+Hauser (USA) Holding Inc.

(57) ABSTRACT

A method for testing a device under test, the device under test being a measuring instrument to measure a physical parameter of a fluid, includes: performing a plurality of valid test runs, wherein a valid test run includes: exposing the device under test and a reference measuring instrument to the fluid under a set of influences, the set of influences being defined by influence parameters; monitoring the influence parameters; obtaining a reference value for the physical parameter from the reference measuring instrument; and obtaining a test value for the physical parameter from the device under test, wherein a test run is invalidated if influence parameters do not meet specified test requirements for the influence parameters; and then evaluating a plurality of test values originating from the plurality of valid test runs with respect to at least one of accuracy, repeatability and reproducibility.

16 Claims, 2 Drawing Sheets

METHOD FOR TESTING A DEVICE UNDER TEST

TECHNICAL FIELD

The present disclosure relates to a method for testing a measuring instrument, for example, during calibration. Such measuring instruments may be field devices for measuring physical parameters of a fluid. The physical parameters may include, for example, mass flow rate, volume flow rate, density, viscosity, pressure temperature, fill level, pH-value, thermal conductivity electrical conductivity or any other parameter of the fluid.

BACKGROUND

Methods for testing a measuring instrument to measure a physical parameter of a fluid, generally include: performing a plurality of valid test runs, wherein a valid test run includes: exposing said device under test and a reference measuring instrument to said fluid; obtaining a reference value for said physical parameter from said reference measuring instrument; and obtaining a test value for said physical parameter from said device under test; and evaluating a plurality of said test values originating from said plurality of valid test runs with respect to at least one of accuracy, repeatability and reproducibility. Testing may be governed by specific industry standards, e.g., the API's MPSM, Chapter 4.8 for the operation of proving systems, which is predominantly intended for operating meter provers on single-phase liquid hydrocarbons.

Testing generally occurs under a set of influences, which could have an adverse effect on the test results, as well as with respect to repeatability and reproducibility as with respect to accuracy. If those influences remain undetected, they may result in a demand for repetitions of the completed test or, even worse, in a complete failure of the test. Therefore, improved methods for testing a device under test are needed in this area of technology.

SUMMARY

The present disclosure provides a method for testing a device under test, said device under test being a measuring instrument to measure a physical parameter of a fluid, the method comprising:

performing a plurality of valid test runs, wherein a valid test run comprises:

exposing said device under test and a reference measuring instrument to said fluid under a set of influences, said set of influences being defined by at least one influence parameter;

monitoring said at least one influence parameter;

obtaining a reference value for said physical parameter from said reference measuring instrument; and obtaining a test value for said physical parameter from said device under test, wherein a test run is invalidated if said at least one influence parameter does not meet specified test requirement for said at least one influence parameter; and evaluating a plurality of said test values originating from said plurality of valid test runs with respect to at least one of accuracy, repeatability and reproducibility.

According to an aspect of the present disclosure, said device under test and said reference measuring instrument are exposed to said fluid with a constant value of said physical parameter for said plurality of valid runs.

According to an aspect of the present disclosure, the method further comprises evaluating a plurality of said test values originating from said plurality of valid test runs with reference to a plurality of said reference values originating from said plurality of valid test runs.

According to an aspect of the present disclosure, a test run is aborted if it is invalidated.

According to an aspect of the present disclosure, said at least one influence parameter does not meet said test requirement if its value is outside a specified range or if fluctuations of its value are outside a specified range.

According to an aspect of the present disclosure, said at least one influence parameter comprises at least one property of said fluid.

According to an aspect of the present disclosure, wherein said at least one property of said fluid comprises the physical parameter itself.

According to an aspect of the present disclosure, said at least one property of said fluid comprises at least one of: the physical parameter itself, a flow rate of said fluid, a density of said fluid, a temperature of said fluid, a pressure of said fluid, a viscosity a said fluid, a speed of sound of said fluid, a Reynolds number of said fluid, a thermal conductivity of said fluid, a Prandtl number or a Nusselt number of said fluid, an electrical conductivity of said fluid, an electrical resistivity of said fluid, a dielectric constant of said fluid, a pH-value of said fluid, a turbidity of said fluid, an absorbance of an acoustic signal propagating through said fluid, or an absorbance of an electromagnetic signal propagating through said fluid.

According to an aspect of the present disclosure, said fluid comprises a first liquid and wherein said at least one property of said fluid pertains to cavitation, evaporation, entrained gas, contamination by a second liquid or solids.

According to an aspect of the present disclosure, said at least one influence parameter pertains to at least one property at least one of a component of the device under test, which component is exposed to the fluid; and a component of the reference measuring instrument, which component is exposed to the fluid.

According to an aspect of the present disclosure, said at least one property comprises at least one of: scale, buildup, deposits, films, or coatings on surfaces of said component; corrosion, erosion, of surfaces of said component; elastic or mechanic parameters of said component; and geometric dimensions of said component.

According to an aspect of the present disclosure, said at least one influence parameter pertains to at least one property of at least one of pumps, valves or pipes in fluid communication with said device under test and said reference measuring instrument, respectively.

According to an aspect of the present disclosure, said device under test comprises: a primary transducer to provide at least one primary signal dependent on the physical parameter; and device circuitry to provide said test value based on said at least one primary signal, wherein said influence parameter pertains to the operation of at least one of the primary transducer and the device circuitry.

According to an aspect of the present disclosure, said device under test comprises: a primary transducer to provide at least one primary signal dependent on the physical parameter; and device circuitry to provide said test value based on said at least one primary signal, wherein said influence parameter pertains to the operation or integrity of at least one of the primary transducer and the device circuitry.

According to an aspect of the present disclosure, said method is executed under the control of a computer, said computer obtaining test values from said device under test and obtaining reference values from the reference measuring instrument and values of said at least one influence parameter, or test results, whether said at least one influence parameter meets said specified test requirement.

According to an aspect of the present disclosure, the device under test comprises a flow meter, the physical parameter comprises a flow rate, and the reference measuring device comprises a prover.

BRIEF DESCRIPTION OF THE DRAWINGS

The present disclosure is further explained in detail below with reference to an exemplary embodiment of the present disclosure illustrated in the drawings, in which.

DETAILED DESCRIPTION OF THE EMBODIMENTS

Figure 1:
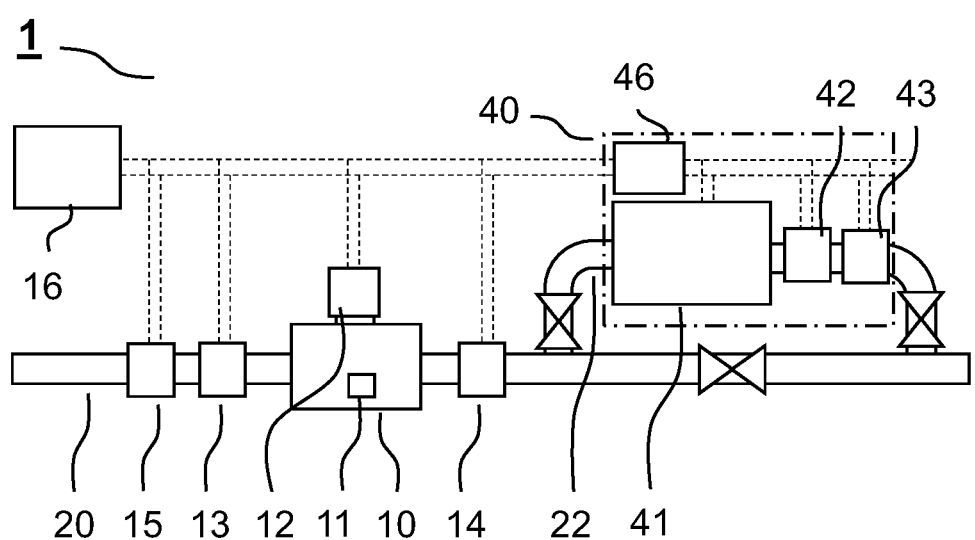
FIG. 1 shows a test installation for implementing the method of the present disclosure.

The installation 1 shown in FIG. 1 comprises a flowmeter 10 which is mounted in a pipeline 20 to measure a flow rate, for example, a volume flow rate through said pipeline 20. The flowmeter 10 is the device to be tested or calibrated by the method according to the present disclosure. The flowmeter 10 comprises a Coriolis-type mass flow transducer 11 and an electronics module 12, for driving the mass flow transducer 11, for receiving sensor signals from the mass flow transducer 11, and for calculating a mass flow rate value, a density value based on said sensor signals, and for calculating a volume flow rate value based on said mass flow rate value and said density value.

The installation 1 further comprises a first pressure sensor 13 connected to the pipeline 20 upstream of the flowmeter 10 and a second pressure sensor 14 connected to the pipeline 20 downstream of the flowmeter 10. A pressure drop across the flowmeter may be calculated, based on the different pressure values of the first and second pressure sensors 13, 14, which in turn enables the calculation of a first viscosity value of the fluid in the pipeline 20 based on said pressure drop and based on said volume flow rate. A second viscosity value of the fluid in the pipeline can be obtained from the damping of oscillations of measuring tubes of the mass flow transducer 11. The installation 1 further comprises a temperature sensor 15 connected to the pipeline 20 to obtain a precise temperature measurement of the fluid in the pipeline 20. The flowmeter 10, the first and second pressure sensors 13, 14 and the temperature sensor 15 are connected to a control system or a flow computer 16.

For testing the flowmeter 10, for example, for calibrating the flow meter 10, a mobile calibration rig 40 is attached to the pipeline 20 in a bypass 22. The calibration rig 40 comprises a prover 41 for measuring a volume flow and further measuring instruments, for instance, a Coriolis-type master mass flow meter 42 and a master temperature sensor 43, which are connected to a calibration flow controller 46 of the calibration rig 40. The flow meter 10 is connected to the calibration flow controller 46 as well.

For a calibration run, the flow through the flowmeter 10 is guided into the prover 41, and the totalized volume or mass according to the flowmeter 10 is compared to the value according to the prover 41.

The installation 1 with the calibration rig 40 is particularly advantageous to provide calibrated measurements of volume flow rates for single-phase liquid hydrocarbons. It is necessary for a flowmeter to have excellent repeatability to successfully pass a calibration, for example, better than ±0.025% in five valid calibration runs under generally well defined and stable flow conditions. To avoid futile attempts for a calibration, the installation 1 is set up to identify influence factors that result in ill-defined or changing flow conditions. For example, the damping of the vibrations of the measuring tubes of the flowmeter 10 or of the master mass flow meter 42 is an influence parameter to be monitored. Fluctuations of the damping are an indication of inhomogeneous fluid properties, for instance, due to water in oil or due to entrained gas in the liquid phase, wherein the entrained gas leads to slug flow or free bubbles. Similarly, the density of the fluid as measured by the flowmeter 10 or of the master mass flow meter 42 is a further influence parameter of interest. Its fluctuations also indicate inhomogeneous fluid properties due to entrained gas. Moreover, fluctuations of a pressure drop across the flowmeter at a constant flow rate are also an indication of an inhomogeneous medium. A sudden change in medium temperature as detected by the temperature sensor 15 also indicates changing conditions. Moreover, if the pressure of the medium at either pressure sensor for a given flow rate and a given temperature approaches the vapor pressure of the medium in the pipeline, this condition indicates a risk of outgassing or cavitation within the flow meter. If the above adverse influences are identified by the analysis of the respective influence parameters, calibration should not proceed.

However, even if there are stable conditions, calibration may not be possible, for example, if the medium contains entrained gas in the form of microbubbles. This condition can be identified by calculating preliminary density values based on the frequencies of two different vibrational bending modes of the measuring tubes of the flowmeter 10. If the density values do not match within a range of tolerance, suspended microbubbles are present in the fluid, as discussed in detail in US 2020/0271494 A1. Similarly, an inhomogeneous medium is indicated, for example, if the first viscosity value based on the pressure drop does not match the second viscosity value based on the damping of the oscillations within a range of tolerance. In that case, calibration should not proceed because a homogeneous medium is required. The above influence medium properties or flow conditions, which may temporarily prevent calibration or testing.

Furthermore, there are influences which may require maintenance, e.g., cleaning, prior to calibration, such as scale, buildup, deposits, films, or coatings in the measuring tubes. The flowmeter 10 is capable of detecting such influences as described in the yet unpublished German patent application DE 102020132949.0.

While the above influence parameters are based on measurements by the sensors the interpretation of the sensor data may be performed by the electronics module 12 of the flowmeter 10, by the calibration flow controller 46, or by both components in cooperation. In the present embodiment, the execution of the method according to the present disclosure may be controlled by the calibration flow controller 46.

The electronics module 12, flow computer 16 and/or calibration flow controller 46 may be configured to perform certain operations comprising a control structure to provide the functions described herein. In certain embodiments, the electronics module 12, flow computer 16 and/or calibration flow controller 46 forms a portion of a processing subsystem that includes one or more computing devices having memory, processing, and/or communication hardware. The electronics module 12, flow computer 16 and/or calibration flow controller 46 may be a single device or a distributed device, and the functions of the electronics module 12, flow computer 16 and/or calibration flow controller 46 may be performed by hardware and/or software. The electronics module 12, flow computer 16 and/or calibration flow controller 46 can include one or more Arithmetic Logic Units (ALUs), Central Processing Units (CPUs), memories, limiters, conditioners, filters, format converters, or the like which are not shown to preserve clarity. In at least one embodiment, the electronics module 12, flow computer 16 and/or calibration flow controller 46 is programmable to execute algorithms and processes data in accordance with operating logic that is defined by programming instructions, such as software or firmware. Alternatively or additionally, operating logic for the electronics module 12, flow computer 16 and/or calibration flow controller 46 can be at least partially defined by hardwired logic or other hardware, for example, using an Application-Specific Integrated Circuit (ASIC) of any suitable type. It should be appreciated that the electronics module 12, flow computer 16 and/or calibration flow controller 46 can be exclusively dedicated to functions described herein or may be further used in the regulation, control, and activation of one or more other subsystems or aspects of the installation 1.

Figure 2:
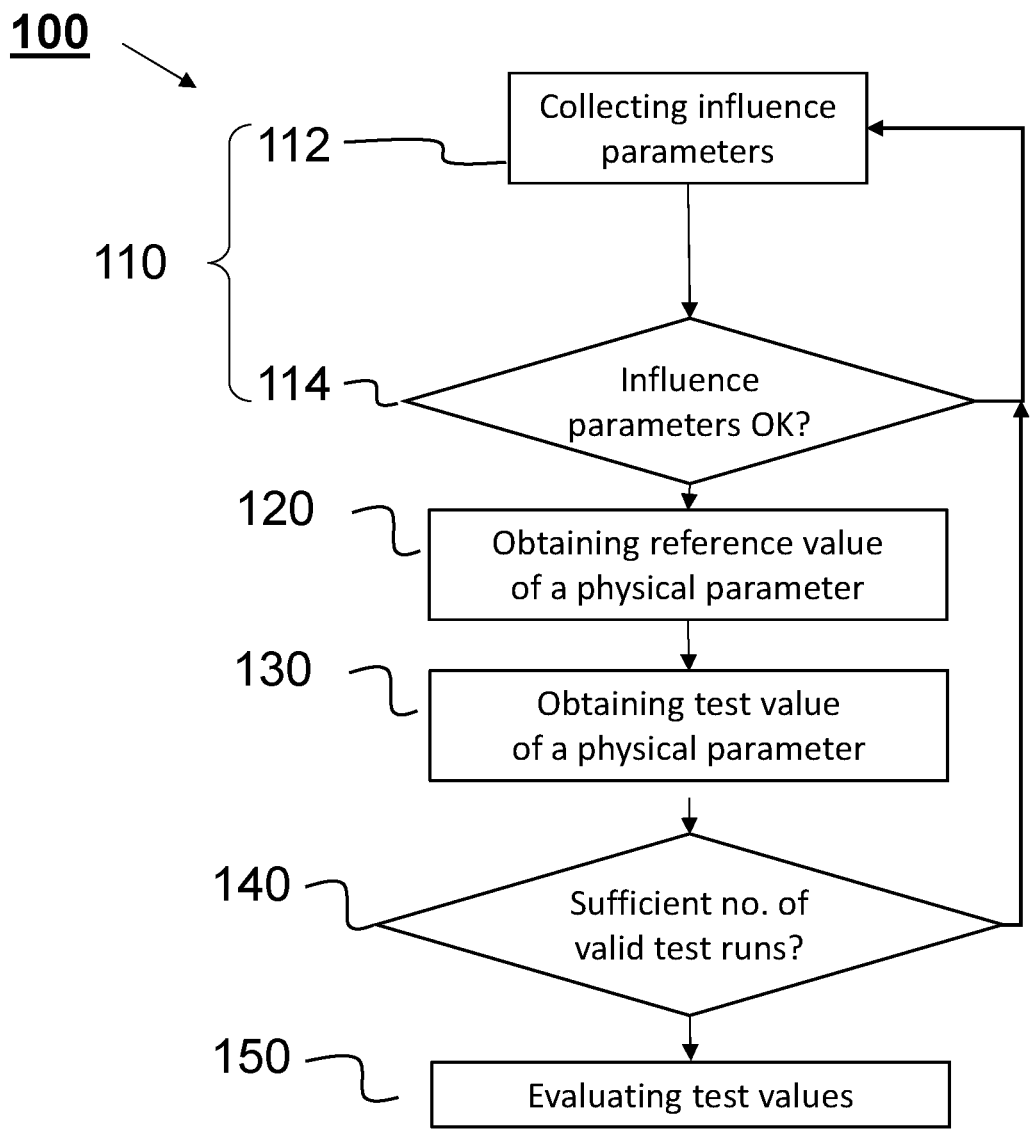
FIG. 2 shows a flow chart of an exemplary embodiment of the present disclosure.

An embodiment of the method according to the present disclosure is described with reference to the flowchart in FIG. 2.

The method starts with the monitoring 110 of influence parameters, which comprises collecting 112 influence parameters and evaluating 114 said influence parameters against specific test criteria. The influence parameters can be any of the parameters discussed above, which have an effect on repeatability or accuracy of the calibration runs, also referred to as test runs. If at least one influence parameter fails, e.g., indicates conditions which would prevent repeatability or sufficient accuracy, continuing with the data acquisition for the calibration would be pointless. Hence, the method 100 starts again with the monitoring 110 of the influence parameters. However, if all monitored influence parameters pass defined criteria, the method 100 proceeds to obtaining a reference value of the physical parameter 120, e.g., from the prover 41 in the installation 1 of FIG. 1, and to obtaining a test value of the physical parameter from the device under test, e.g., the flowmeter 10 in the installation 1 of FIG. 1. Once a sufficient number of valid test runs is confirmed by a branching routine 140, the method proceeds to evaluating 150 the test values, as required by a specific calibration standard. If the number of test runs is not confirmed, the method 100 starts again with monitoring 110 of the influence parameters.

The monitoring 110 of the influence parameters may continue, while the method proceeds to obtaining a reference value and a test value. If at least one influence parameter fails, the data acquisition for obtaining a reference value or and a test value is aborted, and the method returns to start.

The physical parameter itself can be an influence parameter which is monitored in the monitoring operation 110. If, for example, the volume flow rate fluctuates or is outside a specified range, a calibration run for a flow meter may be aborted.

While the method is described with reference to flow meters, the method of the present disclosure may be applied to the calibration of measuring instruments for other physical parameters as well.

The invention claimed is:

1. A method for testing a device under test, the device under test being a measuring instrument configured to measure a physical parameter of a fluid, the method comprising:
    performing a plurality of valid test runs, wherein a valid test run comprises:
        exposing the device under test and a reference measuring instrument to the fluid under a set of influences, the set of influences being defined by at least one influence parameter;
        monitoring the at least one influence parameter;
        obtaining a reference value for the physical parameter from the reference measuring instrument; and
        obtaining a test value for the physical parameter from the device under test,
    wherein a test run is invalidated when the at least one influence parameter does not meet a specified test requirement for the at least one influence parameter; and
    evaluating a plurality of the test values originating from the plurality of valid test runs with respect to at least one of accuracy, repeatability and reproducibility.

2. The method of claim 1, wherein the device under test and the reference measuring instrument are exposed to the fluid with a constant value of the physical parameter for the plurality of valid test runs.

3. The method of claim 1, further comprising:
    evaluating a plurality of the test values originating from the plurality of valid test runs with reference to a plurality of the reference values originating from the plurality of valid test runs.

4. The method of claim 1, wherein a test run is aborted when it is invalidated.

5. The method of claim 1 wherein the at least one influence parameter does not meet the test requirement when its value is outside a specified range or when fluctuations of its value are outside a specified range.

6. The method of claim 1, wherein the at least one influence parameter comprises at least one property of the fluid.

7. The method of claim 6, wherein the at least one property of the fluid comprises the physical parameter itself.

8. The method of claim 6, wherein the at least one property of the fluid comprises at least one of: the physical parameter itself, a flow rate of the fluid, a density of the fluid, a temperature of the fluid, a pressure of the fluid, a viscosity a the fluid, a speed of sound of the fluid, a Reynolds number of the fluid, a thermal conductivity of the fluid, a Prandtl number or a Nusselt number of the fluid, an electrical conductivity of the fluid, an electrical resistivity of the fluid, a dielectric constant of the fluid, a pH-value of the fluid, a turbidity of the fluid, an absorbance of an acoustic signal propagating through the fluid, and an absorbance of an electromagnetic signal propagating through the fluid.

9. The method of claim 6, wherein the fluid comprises a first liquid, and wherein the at least one property of the fluid pertains to cavitation, evaporation, entrained gas, contamination by a second liquid or solids.

10. The method of claim 1, wherein the at least one influence parameter pertains to at least one property of at least one of:

a component of the device under test, which component is exposed to the fluid; and a component of the reference measuring instrument, which component is exposed to the fluid.

11. The method of claim 10, wherein the at least one property comprises at least one of:

scale, buildup, deposits, films, or coatings on surfaces of the component; corrosion, erosion, of surfaces of the component;

elastic or mechanic parameters of the component; and geometric dimensions of the component.

12. The method of claim 1, the at least one influence parameter pertains to at least one property of at least one of: pumps, valves or pipes in fluid communication with the device under test and the reference measuring instrument, respectively.

13. The method of claim 1, wherein the device under test comprises:

a primary transducer configured to generate at least one primary signal dependent on the physical parameter; and device circuitry configured to determine the test value based on the at least one primary signal, wherein the influence parameter pertains to the operation of at least one of the primary transducer and the device circuitry.

14. The method of claim 1, wherein the device under test comprises:

a primary transducer configured to generate at least one primary signal dependent on the physical parameter; and device circuitry configured to determine the test value based on the at least one primary signal, wherein the influence parameter pertains to the operation or integrity of at least one of the primary transducer and the device circuitry.

15. The method of claim 1, wherein the method is executed under the control of a computer, the computer configured to obtain:

test values from the device under test;

reference values from the reference measuring instrument; and values of the at least one influence parameter, or test results, whether the at least one influence parameter meets the specified test requirement.

16. The method of claim 1, wherein the device under test comprises a flow meter, the physical parameter comprises a flow rate, and the reference measuring device comprises a prover.

* * * * *